United States Patent
Zhang et al.

(10) Patent No.: US 9,130,142 B2
(45) Date of Patent: Sep. 8, 2015

(54) MAGNETORESISTIVE DEVICE HAVING SEMICONDUCTOR SUBSTRATE AND PREPARATION METHOD THEREFOR

(75) Inventors: Xiaozhong Zhang, Beijing (CN); Caihua Wan, Beijing (CN); Xili Gao, Beijing (CN); Jimin Wang, Beijing (CN); Lihua Wu, Beijing (CN)

(73) Assignee: Tsinghua University, Beijing (CN)

( * ) Notice: Subject to any disclaimer, the term of this patent is extended or adjusted under 35 U.S.C. 154(b) by 18 days.

(21) Appl. No.: 14/111,683

(22) PCT Filed: Apr. 11, 2012

(86) PCT No.: PCT/CN2012/073792
§ 371 (c)(1),
(2), (4) Date: Oct. 14, 2013

(87) PCT Pub. No.: WO2012/139494
PCT Pub. Date: Oct. 18, 2012

(65) Prior Publication Data
US 2014/0035076 A1   Feb. 6, 2014

(30) Foreign Application Priority Data

Apr. 14, 2011 (CN) .......................... 2011 1 0093833

(51) Int. Cl.
*H01L 29/82* (2006.01)
*H01L 43/02* (2006.01)
*H01L 43/08* (2006.01)
*H01L 43/12* (2006.01)

(52) U.S. Cl.
CPC ................ *H01L 43/02* (2013.01); *H01L 43/08* (2013.01); *H01L 43/12* (2013.01)

(58) Field of Classification Search
None
See application file for complete search history.

(56) References Cited

U.S. PATENT DOCUMENTS 5,373,238 A * 12/1994 McGuire et al. ............... 324/252
5,614,727 A *  3/1997 Mauri et al. .................... 257/43

FOREIGN PATENT DOCUMENTS

CN   102185100 A   9/2011

OTHER PUBLICATIONS

Schoonus et al., "Unravelling the mechanism of large room-temperature magnetoresistance in silicon," Journal of Physics D: Applied Physics, 42 (2009), 185011; 4 pages.*
J.J.H.M. Schoonus et al., "Extremely Large Magnetoresistance in Boron-Doped Silicon," Physical Review Letters, Mar. 28, 2008; Physical Review Letters; PRL 100, 127202 (2008); 4 pages; pp. 127202-1 to 127202-4; ISSN 0031-9007.
(Continued)

*Primary Examiner* — Bilkis Jahan
*Assistant Examiner* — Kevin Quinto
(74) *Attorney, Agent, or Firm* — Reinhart Boerner Van Deuren P.C.

(57) ABSTRACT

The present invention relates to a magnetoresistance device using a semiconductor substrate and a method for manufacturing the same. The magnetoresistance device includes: a semiconductor substrate; an oxidation layer disposed on a surface of the semiconductor substrate; electrodes disposed on the oxidation layer; and at least one diode connected between at least two of the electrodes. The magnetoresistance device of the present invention has excellent performances of a high field magnetoresistance characteristic and high sensitivity at low magnetic field, and has advantages of low power consumption, simple device structure, low cost and simple manufacturing process.

15 Claims, 10 Drawing Sheets

(56) References Cited

OTHER PUBLICATIONS

J.J.H.M. Schoonus et al.; "Unravelling the Mechanism of large room-temperature magnetoresistance in silicon"; Journal of Physics D: Applied Physics 42 (2009) 185011; 4 pages.

Caihua Wan et al.; Geometrical enhancement of low-field magnetoresistance in silicon; Nature, vol. 477; Sep. 15, 2011; 5 pages.

B. Dieny et al.; Magnetotransport properties of magnetically soft spin-valve structures (invited); Journal of Applied Physics 69 (8), Apr. 15, 1991; 7 pages.

S.A. Solin et al.; "Enhanced Room-Temperature Geometric Magnetoresistance in Inhomogeneous Narrow-Gap Semiconductors"; Sep. 1, 2000, vol. 289; 4 pages.

Stuart S. P. Parkin et al.; "Giant tunneling magnetoresistance at room temperature with MgO (100) tunnel barriers"; published online Oct. 31, 2004; Nature Materials, vol. 3, Dec. 2004; 6 pages.

Michael P. Delmo et al.; "Large positive magnetoresistive effect in silicon induced by the space-charge effect"; Letters; vol. 457; Feb. 26, 2009; 5 pages.

\* cited by examiner

MAGNETORESISTIVE DEVICE HAVING SEMICONDUCTOR SUBSTRATE AND PREPARATION METHOD THEREFOR

FIELD OF THE INVENTION

The present invention relates to magnetic detection, magnetic sensor material and device, particularly to a magnetoresistance device using a semiconductor substrate and a manufacturing method thereof.

BACKGROUND OF THE INVENTION

As the core of magnetic storage and magnetic detection technologies, a magnetoresistance effect having significant effect and sensitive magnetic field sensitivity is always a goal to be sought in the magnetic storage industry. Currently developed and applied giant magnetoresistance (GMR) and tunneling magnetoresistance (TMR) devices are mainly based on magnetic metal materials. Semiconductor materials such as silicon (Si) are main stream materials in information industry. In view of the role they currently play in information industry, if these main stream semiconductor materials are utilized to achieve significant giant magnetoresistance devices at room temperature, a magnetoresistance device will be conveniently integrated with a semiconductor device and technology, so as to propel traditional semiconductor microelectronics industry to upgrade toward a magnetoelectronic industry, thus having great significance.

Traditional giant magnetoresistance devices (see, e.g. "Journal of Applied Physics", No. 69; 1991, page 4774) and tunneling magnetoresistance devices (see, e.g. "Nature Materials", No. 3, 2004, from page 862) have excellent sensitivity at low magnetic field, small operating voltage and power consumption. GMR device consists of (magnetic material/non-magnetic material) multilayer film, such as $(Fe/Cr)_n$ multilayer film; and TMR device consists of a sandwich structure of magnetic metal/insulating layer or potential barrier/magnetic metal, such as $Fe_{80}Co_{20}/MgO/Fe_{70}Co_{30}$ structure. These magnetoresistance devices have a resistance change up to the order of 10%~100% under a magnetic field of 10 Oe which is excellent sensitivity at low magnetic field. However, they have very remarkable disadvantages. Firstly, they have isotropic magnetoresistance, and can not be used for sensing the direction of magnetic field. Secondly, their magnetoresistance generally saturates under small magnetic field, therefore they can not be used for sensing medium and strong magnetic fields. Thirdly, the manufacturing of these magnetoresistance devices needs transition metals, rare earth metals and the like, which not only leads to high cost, but also makes the manufacturing process incompatible with silicon process. The silicon process generally does not use transition metals as much as possible, since a family of transition metals may cause un-controllable doping of silicon, and reduce performances of silicon electronic elements.

In 2009, Delmo et al. invented a pure Si-based magnetoresistance device ("Nature", No. 457, 2009, page 1112). This device realizes magnetoresistance of $10^3$% under 300K room temperature and 3 T magnetic field. This magnetoresistance value is 2 orders of magnitude higher than normal magnetoresistance in Si, which brings about a hope for realizing practical Si-based magnetoresistance devices. However, this device has low sensitivity at small magnetic fields and requires high working voltage (100V level) and high power (0.1 W~1 W), thus still falls far short of practical industrial application. In the same year, Schoonus et al. also found remarkable magnetoresistance effect in pure Si and realized $10^3$% of magnetoresistance under 1 T magnetic field ("Journal of Physics D: Applied Physics", No. 42, 2009, page 185011). However, similarly to Delmo, this device has high operating voltage and high power consumption, even higher than those of Delmo's device, hence its practical application value is very limited.

Other than Si-based giant magnetoresistance materials, other systems can also realize remarkable magnetoresistance characteristic and have low field sensitivity and low power consumption, such as a magnetoresistor of InSb/Au structure which was invented by Solin et al. ("Science", No. 289, 2000, page 1530). This kind of magnetoresistance device consists of a central aurum disk and an InSb circular ring surrounding the aurum disk. This structure can realize 100% apparent magnetoresistance performance under 0.05 T magnetic field, which approximate performances of commercial giant magnetoresistance and tunneling magnetoresistance devices. Despite having excellent performances, this device has a complex structure, which results in complicated manufacturing process and raw materials of high cost, as well as difficult device miniaturization. These disadvantages limit its large scale application.

SUMMARY OF THE INVENTION

An object of the present invention is to provide a magnetoresistance device using a semiconductor substrate and manufacturing method thereof.

The present invention provides a magnetoresistance device including: a semiconductor substrate; an oxidation layer disposed on a surface of said semiconductor substrate; electrodes disposed on said oxidation layer; and at least one diode connected between at least two electrodes of said electrodes.

The present invention further provides a method for manufacturing a magnetoresistance device including: cleaning and cutting a semiconductor substrate; forming an oxidation layer on a surface of said semiconductor substrate; forming electrodes on said oxidation layer; and connecting at least one diode between at least two electrodes of said electrodes.

The present invention further provides a Si-based self-energized magnetic sensor including: a silicon substrate; an oxidation layer disposed on a surface of a first region of said silicon substrate; electrodes disposed on said oxidation layer; and at least one diode connected between at least two electrodes of said electrodes; and a Si-based solar battery disposed on a second area of said silicon substrate which acts as a substrate; wherein power output terminals of said Si-based solar battery are connected with at least two of said electrodes to output electrical energy.

The present invention further provides a non-contact magnetic sensor including: a magnetic component, configured to generate a magnetic field, disposed on a first position and movable to a second position; and the magnetoresistance device according to the present invention as stated above, disposed on a second position and configured to sense a magnetic field when said magnetic component approaches said magnetoresistance device. The non-contact magnetic sensor according to the present invention can detect a movement of an object in a non-contact way, such as detecting speeds of various vehicles.

The magnetoresistance device according to the present invention has excellent performances including a high field magnetoresistance characteristic and high sensitivity at low magnetic field, and has advantages of low power consumption, simple device structure, low cost and simple manufacturing process.

Embodiments of the present invention will be described in detail below with reference to the drawings.

DETAIL DESCRIPTION OF THE INVENTION

The following embodiments allow those skilled in the art to fully understand specific implementations of the present invention, but are not intended to limit the present invention in any way.

The magnetoresistance device according to an embodiment of the present invention includes a semiconductor substrate, an oxidation layer, several electrodes and a diode disposed between the electrodes. The semiconductor substrates in the following embodiments are a silicon substrate or a monocrystalline silicon substrate, as an example, but are not limited thereto; and substrates of other semiconductor materials can also be used. The number of electrodes in the device can be 4 or more. A geometric shape formed by lines of connecting the electrodes may be a rectangle or other parallelogram, or other geometric shapes. The resistance distribution or the resistance value of the device is dependent on the geometric shape of the electrode configuration. According to an embodiment of the present invention, the electrodes can be made up of ordinary metallic materials, preferably metal materials (such as Al, Ti, In) that can form Ohmic contact with the semiconductor substrate, so as to ensure small contact resistance between electrodes and the semiconductor substrate. The diode utilized in the magnetoresistance device according to the present invention can be any type of diode, such as Si-based or GaAs-based diode, and can also be Zener diode or other types of diodes. Generally, connecting one diode in the device can satisfy requirements of the magnetoresistance performance, and two diodes can also be connected between electrodes according to practical application. The diodes can be connected between at least two electrodes on any side of the geometric shape of the electrode configuration, and preferably, connected between electrodes on two ends of at least one long side which has a long distance between electrodes in the geometric shape.

Embodiments of the present invention utilize resistance performance of semiconductor materials; and the resistivity of the utilized semiconductor substrate is preferably greater than 0.1 $\Omega \cdot cm$.

According to an embodiment of the present invention, minority carriers in the silicon substrate have a lifetime preferably greater than 10 μs. The mobility of silicon substrate is at least 0.1 $m^2/Vs$ for n type silicon, and at least 0.04 $m^2/Vs$ for p type silicon, so as to ensure sufficient large mobility for silicon substrates. Because intrinsic magnetoresistance of silicon is proportional to the square of the product of silicon substrate mobility and the magnetic field intensity, the larger the mobility is, the larger the apparent magnetoresistance exhibited by the magnetoresistance device is, hence the better the magnetoresistance performance is.

First Embodiment

Figure 1:
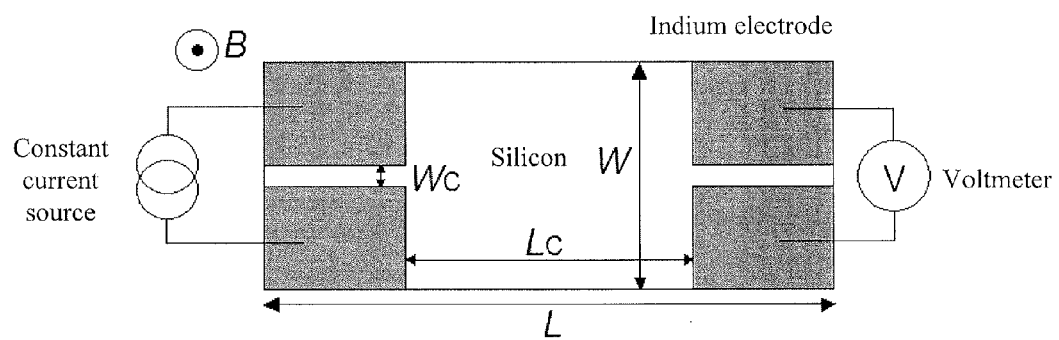
FIG. 1 schematically shows a structure of a Si-based magnetoresistance device according to an embodiment of the present invention, in which a constant current source and a voltmeter are contained in the same digital source meter for testing magnetoresistance performance of the magnetoresistance device.

Manufacturing of Si-Based Magnetoresistance Device:

(1) A n type Si (100) substrate with a resistivity of 3000 $\Omega \cdot cm$ is rinsed and cleaned with alcohol, and cut into strips with length L=7 mm and width W=3 mm, as shown in FIG. 1;

(2) The strips of n type Si (100) substrate are placed under room temperature and atmospheric condition for 3 hours (h); and the surface of the Si substrate is oxidized to form a $SiO_2$ oxide layer.

(3) Four electrodes are obtained by extruding high purity (greater than 99.9%) soft metal indium (In), and are pressed on four corners of the strip of Si substrate respectively. The size of each electrode is 0.5 mm in long side (lateral) direction of Si substrate by 1.4 mm in short side (longitudinal) direction of Si substrate. Therefore, the interval between two electrodes in long side direction is Lc=6 mm, and the interval between two electrodes in short side direction is Wc=0.2 mm. The above-mentioned parameters are shown in FIG. 1. Subsequently, the device is placed on a heating plate and is heated under 300° C. for 10 minutes, and then is allowed to naturally cool down to room temperature. So far, a Si-based magnetoresistance device is basically prepared. Further, a diode needs to be connected between electrodes to obtain a magnetoresistance device, as a final product.

The resultant Si-based magnetoresistance device is provided with a $SiO_2$ oxidation layer on a surface of a monocrystalline Si (100) substrate; four electrodes are connected on the oxidation layer; and lines of connecting the four electrodes form a geometric shape of a rectangular. In the rectangular, a ratio of electrode interval in long side direction Lc to that in short side direction We is 30, that is, Lc/Wc=30; and the thickness of the oxidation layer is 1.6 nm.

The manufactured Si-based magnetoresistance device can be structurally characterized with a transmission electron microscope (TEM). Its interface structure can also be observed with TEM. The volt-ampere (IV) performance of the magnetoresistance device can be measured with four-electrode method using a digital source meter (such as Keithley 2400 source meter) which contains a constant current source and a voltmeter. A superconducting quantum interference device (SQUID) applies an external magnetic field B to the magnetoresistance device in a direction perpendicular to the substrate surface; and the magnetoresistance performance of the magnetoresistance device can be measured in SQUID by a Keithley 2400 source meter. Two pairs of electrodes on Si surface which lie close to each other are configured to connect the constant current source and the voltmeter in the digital source meter respectively, as shown in FIG. 1. In the Si-based magnetoresistance device of this embodiment, the intrinsic oxidation layer on the silicon surface has a thickness of 1.6 nm.

In this embodiment, besides for connecting the constant current source and the voltmeter, a primary function of the electrodes is to connect the silicon substrate and the diode, and obtain appropriate resistances between connected electrodes. The function of the diode is to increase a rate of change of resistance values of these resistors under an external magnetic field so as to realize desired magnetoresistance performances.

It should be noted that, although the diode is not shown in FIG. 1, the diode actually exists between two electrodes in a lateral direction in FIG. 1, because devices similar to the diode are provided between the constant current source and the voltmeter in the Keithley 2400 digital source meter. Therefore, it is not necessary to provide a diode again, during testing the performance of the magnetoresistance device of FIG. 1; and the desired magnetoresistance performances can also be tested.

Figure 2:
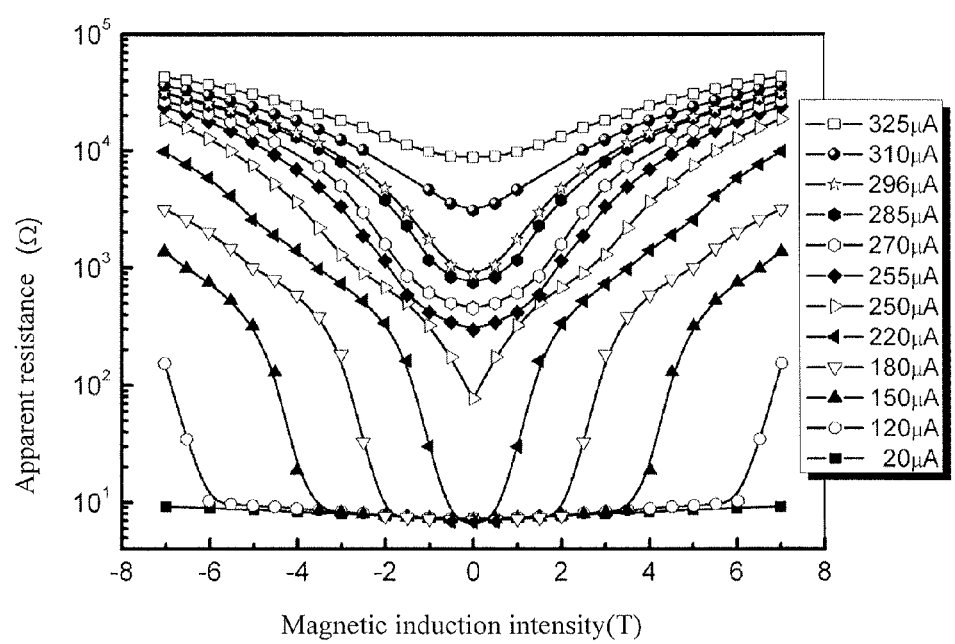
FIG. 2 shows the dependence characteristic of magnetoresistance of the Si-base magnetoresistance device according to a first embodiment on high magnetic field.

FIG. 2 shows the dependence relationship of the magnetoresistance (vertical axis) of the Si-based magnetoresistance device of the first embodiment at room temperature on the magnetic induction intensity (horizontal axis) of the applied magnetic field, and illustrates the apparent resistance change curve of the device as a function of magnetic induction intensity of the magnetic field under conditions of different currents (20 μA to 325 μA). As shown in FIG. 2, as the magnetic field increases, prior to a certain critical magnetic field (for example, when the current is 180 μA, the critical magnetic field is 1.8 T), the resistance between the two electrodes that connect the voltmeter slowly increases at first. When the magnetic field is greater than the critical magnetic field, the magnetoresistance increases steeply. And this critical magnetic field is dependent on the current flowing through the device. As the current increases from 120 μA to 220 μA, the critical magnetic field decreases from 6 T to 0.5 T. When the current further increases, the critical magnetic field decreases to 0. Therefore, when the current is 250 μA or more, the resistance increases rapidly as the magnetic field increases from 0 T towards positive or negative direction. However, at this time, the magnetoresistance effect under high field is reduced with respect to the magnetoresistance under smaller current. For example, under the condition of 296 μA current, as the magnetoresistance increases from 0 T to positive or negative 7 T, the resistance only changes by 1.5 orders of magnitude. While under the condition of 220 μA current, the resistance changes by 4 orders of magnitude. However, even under the condition of a very large current, such as a current of 325 μA, although the resistance only changes by about 5 times (the magnetoresistance MR≈500%), this magnitude of magnetoresistance is still 1 order of magnitude larger than a normal Si-based magnetoresistance. The normal Si-based magnetoresistance is about 50% under the condition of 7 T.

Here, the magnetoresistance is defined as MR(B, I)=[V(B, I)−V(0, I)]/V(0, I)×100%

Where B is the magnetic field, I is the current, and V is the voltage. Here, the magnetoresistance of 50% means that the voltage V(B, I) after applying magnetic field is 50% greater than the voltage V(0, I) before applying magnetic field.

The reason why the magnetoresistance device of the first embodiment has such a huge magnetoresistance value is that the diode has an amplification effect and the size of the silicon substrate has a large $L_C/W_C$ ratio.

Second Embodiment

Manufacturing of Si-Based Magnetoresistance Device:

(1) A n type Si (100) substrate with a resistivity of 3000 Ωcm is rinsed and cleaned with alcohol and cut into strips with length L=7 mm and width W=3 mm.

(2) The strip of n type Si (100) substrate is placed under room temperature and atmospheric condition for 3 hours; and the surface of the Si substrate is oxidized to form a $SiO_2$ oxide layer.

(3) Four electrodes are obtained by extruding a high purity (purity >99.9%) soft metal indium (In), and are pressed on four corners of the strip of Si substrate respectively. The size of the electrode is 0.5 mm in length (long side or lateral) direction of the Si substrate by 1.45 mm in width (short side or longitudinal) direction of the Si substrate. Therefore, $L_C$=6 mm, $W_C$=0.1 mm. The above-mentioned parameters are shown in FIG. 1. Subsequently, the manufactured device is placed on a heating plate and heated under 300° C. for 10 minutes, and then is allowed to naturally cool down to room temperature. So far, a Si-based magnetoresistance device is basically prepared. A diode needs to be connected between electrodes to obtain a magnetoresistance device as a final product.

The resultant Si-based geometric giant magnetoresistance device is provided with a $SiO_2$ oxidation layer on the surface of the monocrystalline Si (100) substrate. Four electrodes are pressed on the oxidation layer; and a geometric configuration of the four electrodes is a rectangular, in which the ratio of the interval $L_C$ between two electrodes in length direction to the interval $W_C$ between two electrodes in width direction is 60, namely $L_C/W_C$=60. The oxidation layer has a thickness of 1.6 mm.

Figure 3:
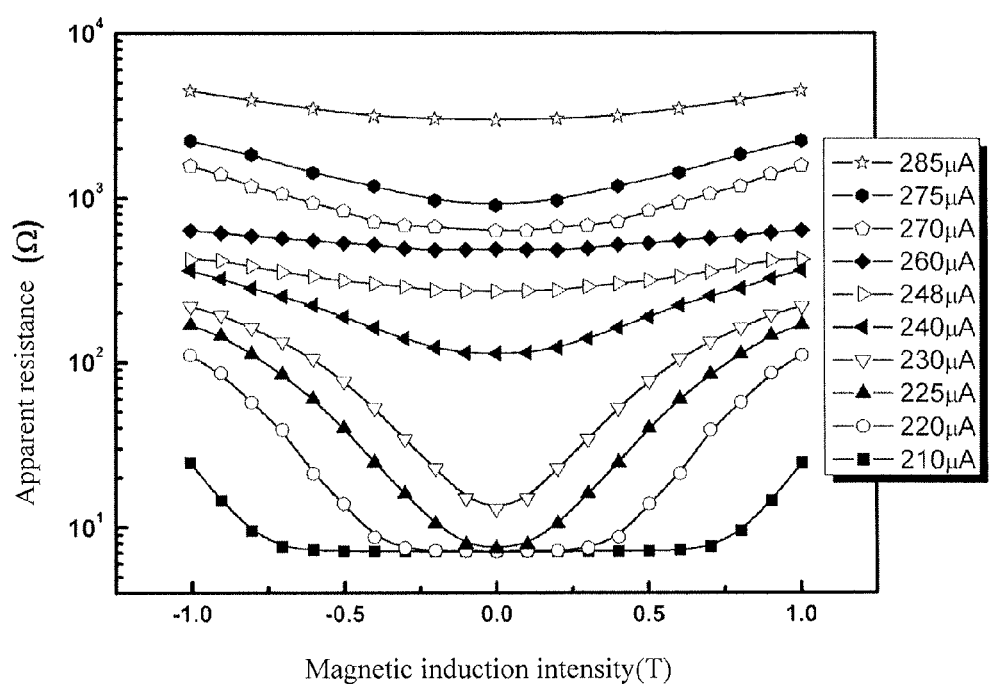
FIG. 3 shows the dependence characteristic of magnetoresistance of the Si-base magnetoresistance device according to second embodiment on low magnetic field.

The method of measuring the magnetoresistance performance of the device is the same as that of the first embodiment. FIG. 3 shows a change curve of an apparent resistance exhibited by the device of the second embodiment as a function of magnetic induction intensity of the magnetic field under conditions of different currents (210 μA to 285 μA).

The Si-based geometric giant magnetoresistance device manufactured with the above method has a resistance change up to 10 times or more (that is, the voltage after applying magnetic field increases 10 times with respect to the voltage before applying magnetic field, in other words, the magnetoresistance is $10^3$%) and a magnetic field sensitivity better than the performance of Si-based magnetoresistance device of prior art, under room temperature of 300K and magnetic field of 1 T. Under conditions of some currents (such as 225 μA to 250 μA), and under a magnetic field of 0.5 T, a magnetoresistance of $10^3$% can be realized; and under a magnetic field of 0.2 T, a magnetoresistance of 100% can also be realized, as shown in FIG. 3. This high field sensitivity at low magnetic field is comparable with the InSb-based magnetoresistance device invented by Solin et al. The reason why the device of the embodiment can realize such high sensitivity at low magnetic field is that the diode has amplification effect and the size of the silicon substrate has a large $L_C/W_C$ ratio.

Third Embodiment

Manufacturing of Si-Based Magnetoresistance Device:

(1) A n type Si (100) substrate with a resistivity of 3000 Ω·cm is rinsed and cleaned with alcohol and cut into strips with length L=7 mm and width W=3 mm.

(2) The strip of n type Si (100) substrate is placed under room temperature and atmospheric condition for 24 hours; and the surface of the Si substrate is oxidized to form a $SiO_2$ oxide layer.

(3) Electrodes are obtained by extruding a high purity soft metal indium (In) (purity >99.9%) on four corners of the strip of Si substrate. The size of the electrode is 0.5 mm in length direction of the Si substrate by 1.45 mm in width direction of the Si substrate. Therefore, $L_C$=6 mm, $W_C$=0.1 mm. The above-mentioned parameters are shown in FIG. 1. So far, a Si-based magnetoresistance device is prepared. A diode needs to be connected between electrodes to obtain a magnetoresistance device as a final product.

The resultant Si-based magnetoresistance device is provided with a $SiO_2$ oxidation layer on the surface of the monocrystalline Si (100) substrate. Four electrodes are deposited on the oxidation layer to form a geometric configuration of a rectangular. The ratio of the interval $L_C$ between two electrodes in length direction to the interval $W_C$ between two electrodes in width direction is 60, namely, $L_C/W_C$=60. The oxidation layer has a thickness of 1.6 nm.

The method of measuring the magnetoresistance performance of the device is the same as that of the first embodiment.

The Si-based magnetoresistance device manufactured with the above method also has a resistance change up to 10 times or more and a magnetic field sensitivity better than the performance of Si-based magnetoresistance device of prior arts under room temperature of 300K and magnetic field of 1 T. Under conditions of certain currents (such as 0.210 mA to 0.257 mA) and a magnetic field of 0.5 T, a magnetoresistance of $10^3$% can be realized; and a magnetoresistance of 110% can be realized under a magnetic field of 0.2 T.

Fourth Embodiment

Manufacturing of Si-Based Magnetoresistance Device:

(1) A n type Si (100) substrate with a resistivity of 3000 Ωcm is rinsed and cleaned with alcohol and cut into strips with length L=7 mm and width W=3 mm.

(2) The strip of n type Si (100) substrate is placed in a pulsed laser deposition apparatus which deposits $Al_2O_3$ layer of 2.0 nm thickness on a surface of the substrate.

(3) Electrodes are obtained by magnetron sputtering high purity metal Al (purity >99.9%) to deposit on four corners of the strip of Si substrate. The size of the electrode is 0.5 mm in length direction of the Si substrate by 1.45 mm in width direction of the Si substrate. Therefore, $L_C$=6 mm, $W_C$=0.1 mm. The above-mentioned parameters are shown in FIG. 1. So far, a Si-based magnetoresistance device is basically prepared. Further, a diode needs to be connected between the electrodes to obtain a magnetoresistance device as a final product.

The resultant Si-based magnetoresistance device is provided with an $Al_2O_3$ oxidation layer on the surface of monocrystalline Si (100) substrate. Four electrodes are deposited on the oxidation layer and form a geometric configuration of a rectangular, in which a ratio of the interval $L_C$ between two electrodes in length direction to the interval $W_C$ between two electrodes in width direction is 60, namely $L_C/W_C$=60. The oxidation layer has a thickness of 2.0 nm. The method of measuring the magnetoresistance performance of the device is the same as that of the first embodiment.

The Si-based magnetoresistance device manufactured with the above method also has a resistance change up to 5 times or more under room temperature of 300K and magnetic field of 1 T, i.e., MR=500%.

Fifth Embodiment

Manufacturing of Si-Based Magnetoresistance Device:

(1) A n type Si (100) substrate with a resistivity of 1000 Ω·cm is rinsed and cleaned with alcohol and cut into strips with length L=7 mm and width W=3 mm.

(2) The strip of n type Si (100) substrate is placed in a pulsed laser deposition apparatus which deposits MgO layer of 2.5 nm thickness on a surface of the substrate.

(3) Four electrodes are obtained by magnetron sputtering high purity metal Al (purity >99.9%) to deposit on four corners of the strip of Si substrate. The size of the electrode is 0.5 mm in length direction of the Si substrate by 0.90 mm in width direction of the Si substrate. Therefore, $L_C$=6 mm, $W_C$=1.2 mm. The above-mentioned parameters are shown in FIG. 1. So far, a Si-based magnetoresistance device is basically prepared. Further, a diodes needs to be connected between electrodes to obtain a magnetoresistance device as a final product.

The resultant Si-based magnetoresistance device is provided with a MgO oxidation layer on the surface of single crystal Si (100) substrate. Four electrodes are displaced on the oxidation layer and form a geometric configuration of a rectangular, in which a ratio of the interval $L_C$ between two electrodes in length direction to the interval $W_C$ between two electrodes in width direction is 5, namely $L_C/W_C$=5. The oxidation layer has a thickness of 2.5 nm.

The Si-based magnetoresistance device manufactured with the above method also has a resistance change up to 8 times or more under room temperature of 300K and magnetic field of 1 T.

Sixth Embodiment

Figure 4A:
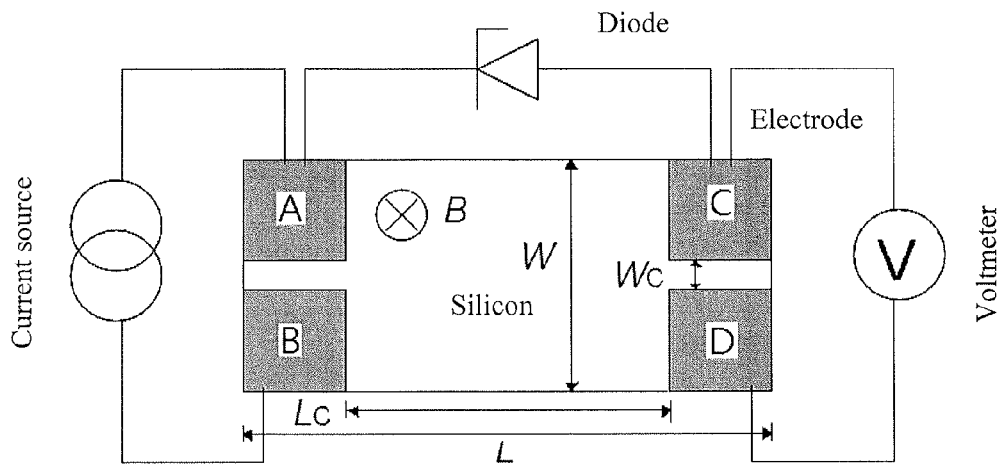
FIG. 4A shows a configuration for testing performance of a Si-based magnetoresistance device according to an embodiment of the present invention, in which a current source and a voltmeter are separately configured for testing magnetoresistance performance of the magnetoresistance device.
Figure 4B:
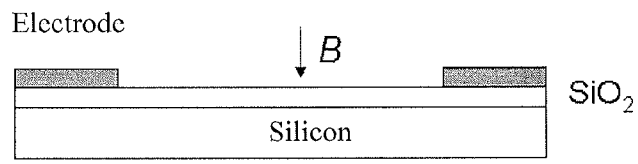
FIG. 4B is a front view of the Si-based magnetoresistance device according to an embodiment of the present invention.
Figure 4C:
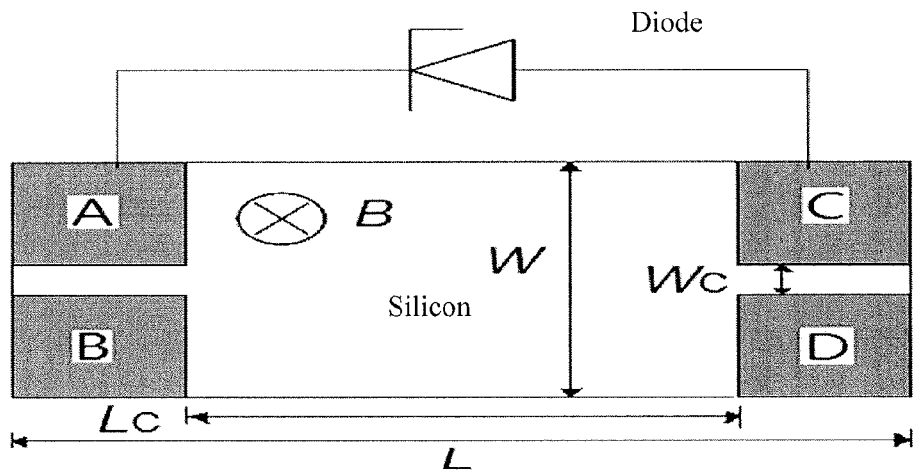
FIG. 4C is a top view of the Si-based magnetoresistance device according to an embodiment of the present invention.

Manufacturing of Si-Based Magnetoresistance Device:

A n type Si (100) substrate with a resistivity of 3000 Ω·cm is rinsed and cleaned with alcohol and cut into strips with length L=12.0 mm and width W=2.1 mm. As shown in FIGS. 4B and 4C, a silicon dioxide layer is formed on the Si substrate. Four Ti/Al electrodes (A, B, C, D) are deposited on four corners of the strip of Si substrate. The size of the electrode is 1.0 mm in length (lateral long side) direction of the Si substrate by 1.0 mm in width (longitudinal short side) direction of the Si substrate. Therefore, an electrode interval $L_C$ in long side direction is 10 mm, and an electrode interval $W_C$ in short side direction is 0.1 mm. A Zener diode with 10.1 V of reverse breakdown voltage is connected in parallel between two electrodes (such as electrodes A, C) on the long side. So far, a Si-based magnetoresistance device is prepared.

Figure 5:
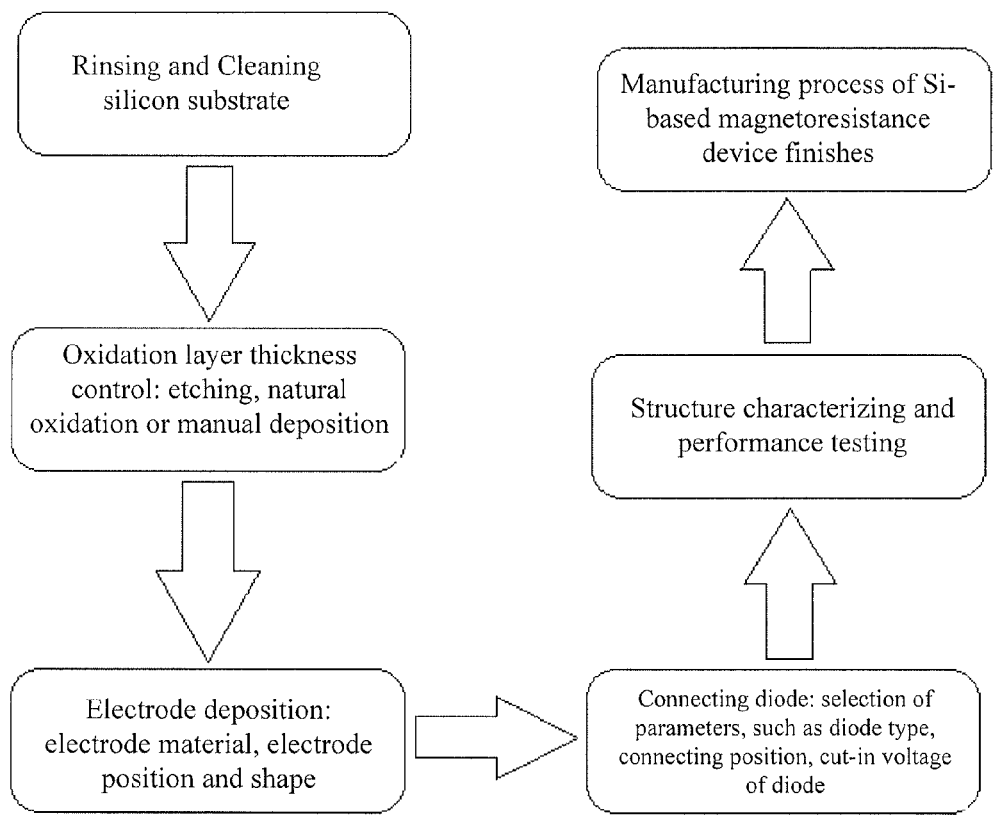
FIG. 5 shows a flowchart of manufacturing Si-based magnetoresistance device according to an embodiment of the present invention.

This embodiment can utilize the process for manufacturing the Si-based magnetoresistance device, as shown in FIG. 5. In FIG. 5, when forming an oxidation layer, a thickness of the oxidation layer can be controlled by etching, natural oxidation, deposition or the like. While depositing electrodes, suitable materials, positions and shapes of the electrodes will be selected. The step of connecting a diode between electrodes includes: selecting the kind of the diode, connecting position of the diode and a cut-in voltage or reverse breakdown voltage of the diode according to practical applications and requirements. After completing structure characterization and performance testing of the device, the whole process of manufacturing the magnetoresistance device is completed.

Structure characterizing for the manufactured Si-based magnetoresistance device can be conducted by a transmission electron microscope (TEM), such as JEOL-2011 model. Its interface structure can be also observed by the transmission electron microscope. A digital source meter (such as Keithley 2400 model and Keithley 2000 model) includes a current source and a voltmeter shown in FIG. 4A, for measuring performances of the magnetoresistance device. The volt-ampere (I-V) performance of the device is measured with four-electrode method in which a current source (e.g. Keithley 2400) provides a constant current source on two electrodes on a short side of the electrode geometric configuration, and a voltmeter (e.g. Keithley 2000) measures a voltage drop between electrodes on another short side. A magnetic field B perpendicular to the silicon substrate is provided by a permanent magnet of 1.2 T or an electromagnet of 0.4 T. Two pairs of electrodes that are closer on the Si surface (i.e., electrodes on two ends of the short side) are respectively connected with Keithley 2400 current source and Keithley 2000 voltmeter, as shown in FIG. 4A. The magnetic sensor device based on Si-based magnetoresistance according to the embodiment has an intrinsic oxidation layer on the silicon surface with a thickness of 1.6 nm.

In each of the first to fifth embodiments as above stated, the Keithley 2400 source meter is used separately for measurement. Because a device similar to Zener diode has been connected between the current source and the voltmeter built in Keithley 2400 source meter, thus no other diode is connected between electrodes in first to fifth embodiments. However, magnetoresistance devices of first to tenth embodiments can actually have consistent physical structures, and consist of a silicon substrate, electrodes and a diode, as shown in FIGS. 4B and 4C.

Hereinafter, the operation process of the magnetoresistance device according to embodiments of the present invention as well as the function of the diode in the magnetoresistance device will be described in detail with reference to the sixth embodiment and FIG. 6.

Figure 6:
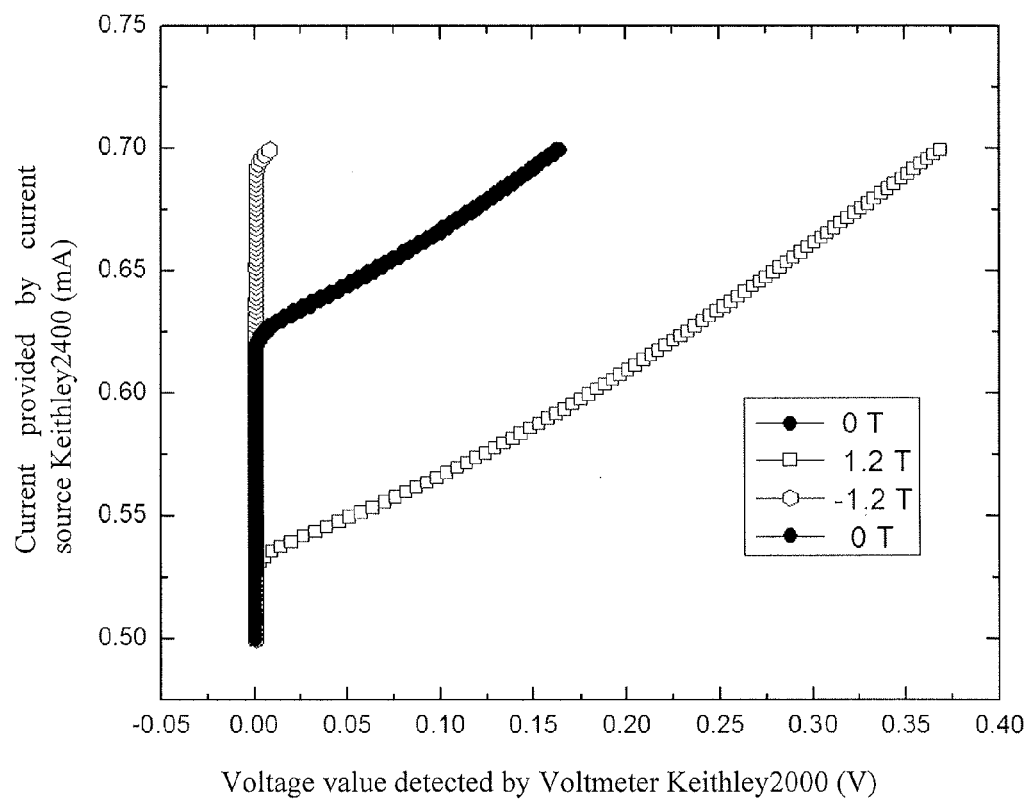
FIG. 6 shows volt-ampere characteristic curve of the Si-based magnetoresistance device according to sixth embodiment under conditions of no magnetic field, positive magnetic field and negative magnetic field.

FIG. 6 shows volt-ampere (I-V) characteristic curves of the Si-based magnetoresistance device obtained by this embodiment under conditions of room temperature, a magnetic field and no magnetic field. The horizontal axis indicates a voltage between electrodes which is measured by the voltmeter; and the vertical axis indicates the current provided by the current source. FIG. 6 illustrates volt-ampere characteristic curves of the magnetoresistance device of the sixth embodiment under conditions of 0, 1.2 T, −1.2 T of magnetic induction intensities of the magnetic field respectively. As shown in FIG. 6, under the condition of 0 T magnetic field, a turning point appears on the I-V curve. Before and after this turning point, there is a sudden change from small to large, in the apparent differential resistance of the sample device. In this embodiment, the turning point corresponds to a current of about 0.6 mA. The appearance of the turning point is dependent on the diode connected in the device. Generally speaking, a diode has switching characteristic or rectifying effect, that is, when the voltage drop across the diode is small than a certain cut-in voltage $U_C$, the resistance of the diode approaches infinity; when a voltage dropped across the diode approaches or exceeds $U_C$, its resistance rapidly decreases to nearly 0. As shown in FIG. 4A, when the voltage across the diode is smaller than $U_C$, the diode is in broken-circuit condition at this time, and the voltmeter detects a voltage between electrodes C and D; when the voltage across the diode is greater than $U_C$, the diode is in short-circuit condition, and the voltmeter detects a voltage between A and D. Since the interval $L_C$ between electrodes AC and electrodes BD is much greater than the interval $W_C$ between electrodes AB and CD, accordingly, resistances of silicon substrate between electrodes AC and BD are much greater than resistances of silicon substrate between electrodes AB and CD respectively, so that a voltage between electrodes AD is much greater than a voltage between electrodes CD. Therefore, when the voltage across the diode changes about $U_C$, the voltage detected by the voltmeter can suddenly increase from a very small value (voltage between electrodes CD) to a very large value (voltage between electrodes AD). Since the volt-ampere characteristic of a Si-based magnetoresistance device is associated with on-state and off-state of the diode, when a state of the diode changes, a turning point appears on the volt-ampere curve. When the turning point appears, the voltage across the diode is equal to $U_C$. The voltage across the diode is controlled by the voltage between electrodes AC. The magnetic field can modulate and control the voltage between electrodes AC (that is, the voltage across the diode), by normal magnetoresistance effect or Hall effect, thereby influencing the state transition of the diode from a broken-circuit state to a short-circuit state. In the aspect of a circuit of the device, the magnetic field B can control the state of diode from "off" to "on" state; and in the aspect of volt-ampere characteristic of the device, the magnetic field B can influence the measured voltage of the turning point.

Figure 7:
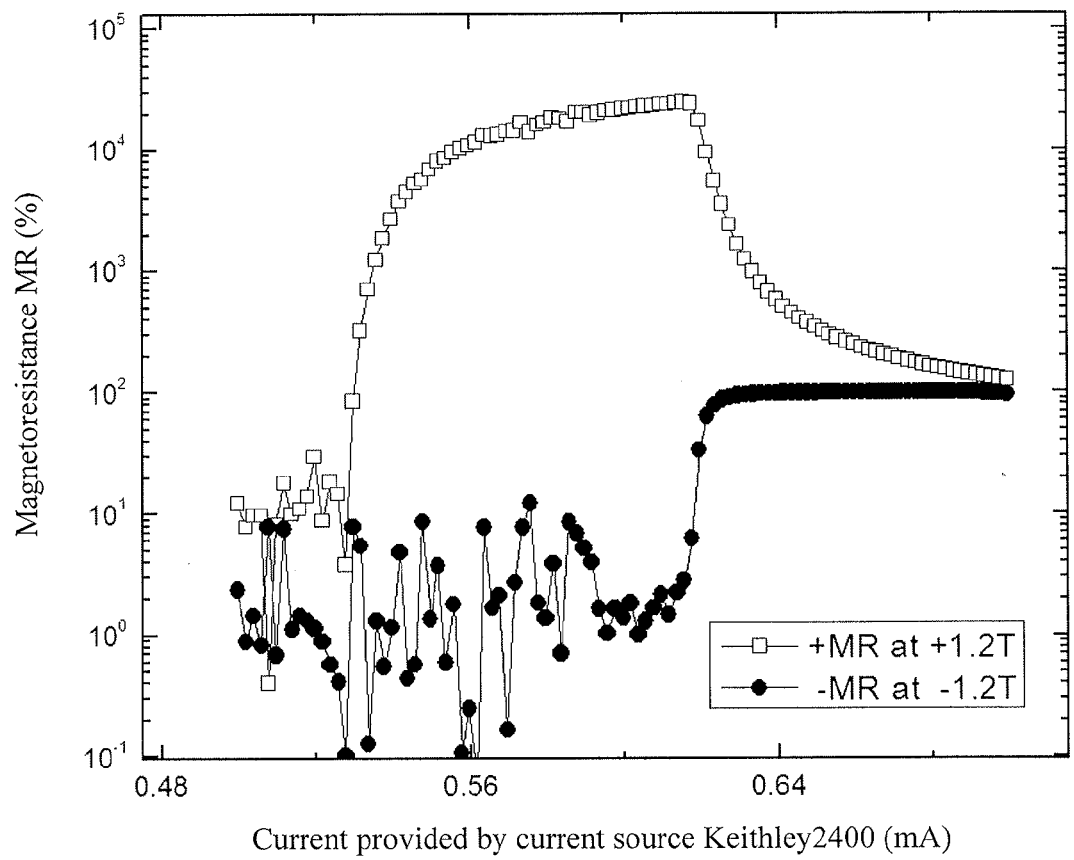
FIG. 7 shows a dependence curve of magnetoresistance of the Si-based magnetoresistance device of sixth embodiment on current.

FIG. 7 shows the dependence curve of magnetoresistance (MR) of the magnetoresistance device of the sixth embodiment on the current, under conditions of magnetic induction intensities 1.2 T, −1.2 T of the magnetic field. In this embodiment, a positive 1.2 T magnetic field will cause the current at the turning point to decrease from 0.6 mA to 0.5 mA, while a negative 1.2 T magnetic field will cause the current at the turning point to increase to 0.7 mA. During the process of the current at the turning point moves with changing magnetic field, a giant magnetoresistance effect appears. Here, the magnetoresistance is defined as MR(B, I)=[V(B, I)−V(0, I)/V(0, I)]×100%. Where V(B, I) is a voltage value detected by the voltmeter when an applied current is I and an applied magnetic field is B; V(0, I) is a voltage value detected by the voltmeter when an applied current is I and an applied magnetic field is 0; and MR(B, I) is the apparent magnetoresistance of the device when an applied current is I and an applied magnetic field is B. Furthermore, in view of the trend that the current at the turning point moves towards low current or high current respectively as the magnetic field increases positively or negatively, the resultant apparent magnetoresistance is positive under a positive magnetic field and is negative under a negative magnetic field. Therefore, this kind of magnetoresistance magnetic sensor not only can sense the magnitude of a magnetic field, but also sense the direction of the magnetic field. In this embodiment, the maximum positive magnetoresistance reaches $2 \times 10^4$%, and a negative magnetoresistance almost reaches −100%, as shown in FIG. 7. Both of these two values are much greater than normal magnetoresistance in silicon (about 3.0% under a magnetic field of 1.2 T), and are also much greater than the positive and negative magnetoresistances of the magnetic sensor invented by Delmo and Schoonus et al. respectively.

When an external magnetic field is applied perpendicularly to the surface of the silicon substrate, since the magnetic field can change the magnitudes of the resistance between electrodes on the long side and the resistance between electrodes on the short side, therefore can change the magnitude of the current $I_C$ at the turning point. The magnetic field can amplify the magnetoresistance by moving upward or downward the position of $I_C$ on the I-V curve, as shown by the curve under magnetic fields of +1.2 T and −1.2 T in FIG. 6.

Therefore, the amplification of magnetoresistance by the diode in the magnetoresistance device according to embodiments of the present invention can be understood as the fact that the magnetic field modulates and controls the voltage dropped between electrodes to control the state transition of the diode from a broken-circuit state to a short-circuit state. This state transition of diode would bring about a huge variation of measured voltage on output terminals (such as between electrodes CD) of the device. This is the reason why this kind of magnetoresistance device containing a diode and a silicon substrate of large $L_C/W_C$ ratio can amplify the intrinsic magnetoresistance of silicon itself.

The scheme for testing the Si-based magnetoresistance device as shown in FIG. 4A is not only suitable for the sixth embodiment 6, but also suitable for the following seventh to tenth embodiments. The current source and the voltmeter are independent equipments; and a diode is connected between at least two electrodes (such as electrodes AC) of the magnetoresistance device under test.

Seventh Embodiment

Figure 8:
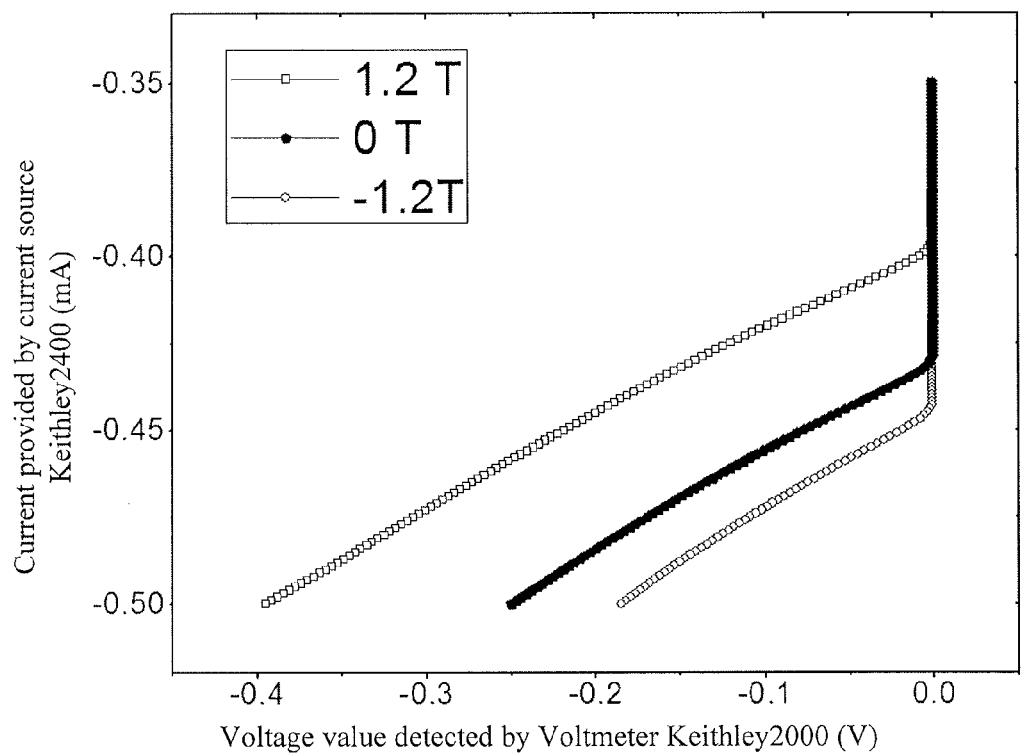
FIG. 8 shows a volt-ampere characteristic curve of the Si-based magnetoresistance device of seventh embodiment under conditions of no magnetic field, positive magnetic field and negative magnetic field.
Figure 9:
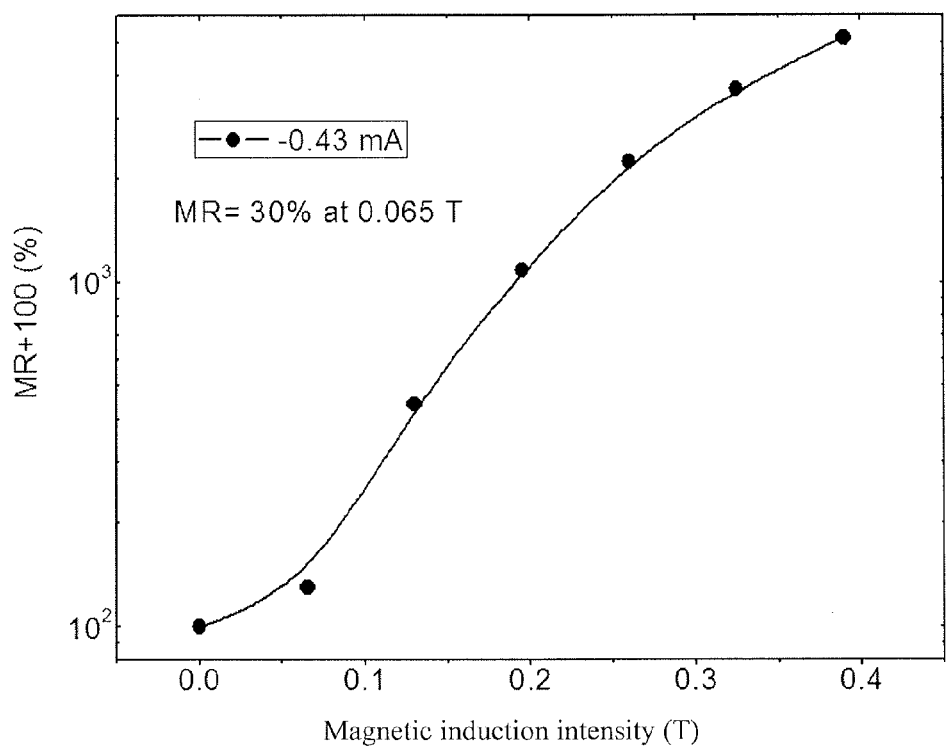
FIG. 9 shows a dependence curve of magnetoresistance of the Si-based magnetoresistance device of seventh embodiment on the magnetic field.

Manufacturing of Si-Based Magnetoresistance Device:

A n type Si (100) substrate with a resistivity of 2000 Ω·cm is rinsed and cleaned with alcohol and cut into strips with length L=12.0 mm and width W=2.1 mm. Four indium (In) electrodes are manufactured and provided on four corners of the strip of Si substrate. The size of the electrode is 1.0 mm in length direction of the Si substrate by 1.0 mm in width direction of the Si substrate. Therefore, an electrode interval $L_C$ in long side direction is 10 mm, and an electrode interval $W_C$ in short side direction is 0.1 mm. A Zener diode with a reverse breakdown voltage of 10.1 V is connected in parallel with two electrodes on the long side. The above-mentioned parameters are shown in FIG. 4C. So far, the Si-based magnetoresistance device of the seventh embodiment is prepared. The method for testing performances of the device is the same as that of the sixth embodiment. FIG. 8 shows volt-ampere characteristic curves of the magnetoresistance device of the seventh embodiment under conditions of 0 T, 1.2 T, −1.2 T of magnetic induction intensities of the magnetic field. FIG. 9 shows the dependence curve of a magnetoresistance (MR) of the magnetoresistance device of the seventh embodiment on a magnetic induction intensity of a magnetic field under a current of 0.43 mA.

The Si-based magnetoresistance device manufactured with the above method also has a resistance change at output terminals up to 50 times or more and a magnetic field sensitivity better than performances of Si-based magnetoresistance devices of prior arts, under a room temperature of 300 K and a magnetic field of 0.4 T. A magnetoresistance of $5\times10^3$% can be realized under certain currents (such as 0.43 mA) and a magnetic field of 0.4 T; a 30% magnetoresistance can be realized under 0.065 T magnetic induction intensity of the magnetic field, as shown in FIGS. 8 and 9. The low-field-magnetic-field sensitivity of this value can be comparable with the InSb-based magnetoresistance device invented by Solin et al.

Eighth Embodiment

Figure 10:
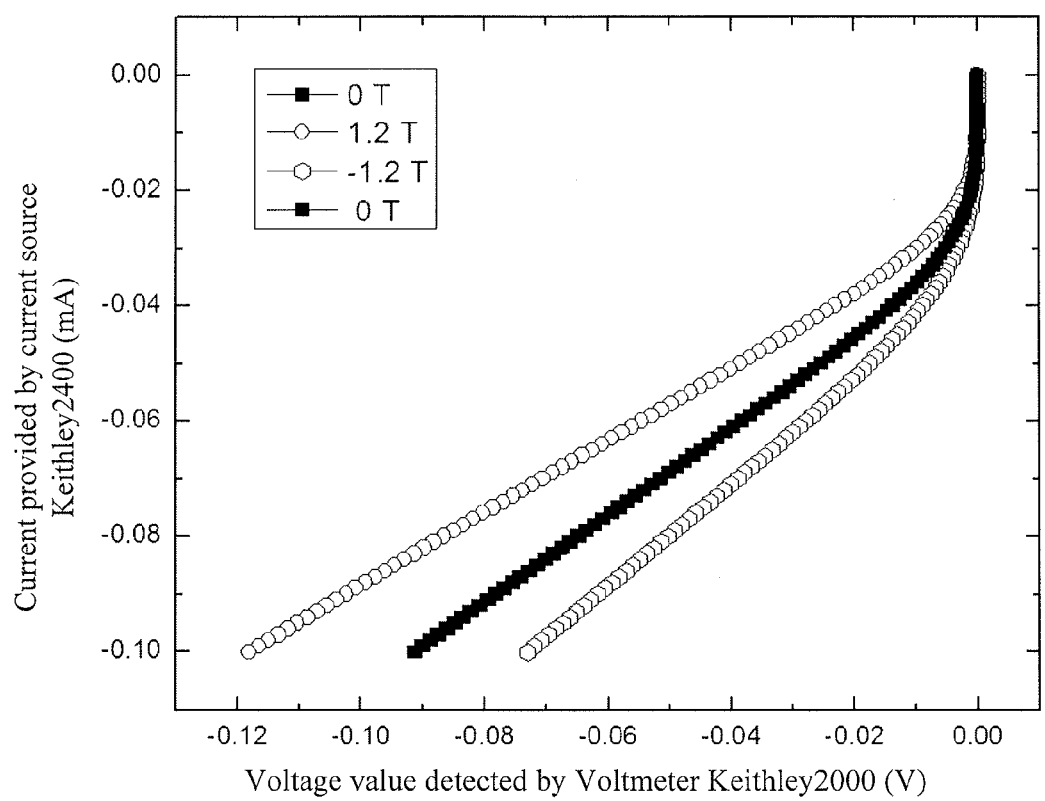
FIG. 10 shows a volt-ampere characteristic curve of the Si-based magnetoresistance device of eighth embodiment under conditions of no magnetic field, positive magnetic field and negative magnetic field.

Manufacturing of Si-Based Magnetoresistance Device:

A n type Si (100) substrate with a resistivity of 1000 Ω·cm is rinsed and cleaned with alcohol and cut into strips with length L=12.0 mm and width W=2.1 mm. Four indium (In) electrodes are manufactured and provided on four corners of the strip of Si substrate. The size of the electrode is 1.0 mm in length direction of the Si substrate by 1.0 mm in width direction of the Si substrate. Therefore, an electrode interval $L_C$=10 mm, and an electrode interval $W_C$=0.1 mm. A diode with a positive cut-in voltage $U_C$ of 0.7 V is connected in parallel with two electrodes on the long side. So far, the Si-based magnetoresistance device of the eighth embodiment is prepared. The method for testing performances of the device is the same as that of the sixth embodiment. FIG. 10 shows volt-ampere characteristic curves of the Si-based magnetoresistance device according to the eighth embodiment under conditions of 0 T, 1.2 T, −1.2 T of magnetic induction intensities of the magnetic field.

As stated in the sixth embodiment, at the turning point on the volt-ampere characteristic curve shown in FIG. 6, the voltage across the diode is equal to $U_C$. Therefore, by selecting a diode with small $U_C$, the current at the turning point can be lowered, thereby lowering a power consumption of the device. In the eighth embodiment, since the cut-in voltage of the selected diode is small, the operating voltage and current of the device can be decreased drastically. As shown in FIG. 10, current at the turning point in the volt-ampere characteristic curve of the eighth embodiment is 20 μA, accordingly the supplied voltage of the current source is about 1V (this voltage is different from the voltage measured by a voltmeter Keithley 2000 under measuring configuration conditions of four-electrode method, but is the output voltage of the current source Keithley 2400), therefore the power consumption of the device is decreased to the order of 20 μW. By decreasing the value of stabilized voltage of the Zener diode, the magnetoresistance device according to the embodiment can operate in lower voltage and lower power ranges. By selecting a diode with large differential conductance around the cut-in voltage, the magnetoresistance performance (including low magnetic field sensitivity) of the magnetoresistance device according to the embodiment can be further improved.

Ninth Embodiment

Manufacturing of Si-Based Magnetoresistance Device:

A n type Si (100) substrate with a resistivity of 1000 Ω·cm is rinsed and cleaned with alcohol and cut into strips with length L=10.0 mm and width W=2.1 mm. Four titanium/aluminum (Ti/Al) electrodes are deposited on four corners of the strip of Si substrate. The size of the electrode is 1.0 mm in length direction of the Si substrate by 1.0 mm in width direction of the Si substrate. Therefore, an electrode interval $L_C$ is 8 mm, and an electrode interval $W_C$ is 0.1 mm. A GaAs light emitting diode with a positive cut-in voltage of 2.5 V is connected in parallel with two electrodes on the long side. So far, the Si-based magnetoresistance device of the ninth embodiment is prepared. The method for testing performances of the device is the same as that of the sixth embodiment.

This magnetoresistance device can exhibit 100% magnetoresistance behavior under a magnetic field of 1.2 T, and since a GaAs light emitting diode is used, a bias voltage on the diode can be controlled by an external magnetic field, so as to control its luminous power. For example, under a magnetic field of 0 T, the diode does not emit light at a current of the turning point. However, after applying a positive 1.2 T magnetic field, the diode starts to emit light. In the ninth embodiment, the photomagnetoelectric coupling can be realized even in a same device.

Tenth Embodiment

Manufacturing of Si-Based Magnetoresistance Device:

A n type Si (100) substrate with a resistivity of 10 Ω·cm is rinsed and cleaned with alcohol and cut into strips with length L=5.0 mm and width W=2.2 mm. Firstly, the strip of silicon substrate is placed in 10% hydrofluoric acid (HF) solution and is etched for 10 minutes, to remove the intrinsic oxidation layer from the silicon surface. When the strip of silicon substrate is taken out from the HF solution, four indium (In) electrodes are quickly cold-pressed on four corners of the strip of Si substrate. The size of the electrode is 1.0 mm in length direction of the Si substrate by 1.0 mm in width direction of the Si substrate. Therefore, an electrode interval $L_C$ is 3.0 mm, and an electrode interval $W_C$ is 0.2 mm. A Si-based diode with a positive cut-in voltage of 0.7 V is connected in parallel with two electrodes on a long side. So far, the Si-based magnetoresistance device of the tenth embodiment is prepared. The method for testing performances of the device is the same as that of the sixth embodiment.

The magnetoresistance device can exhibit 40% positive magnetoresistance under a positive 1.2 T magnetic field, and exhibit a 30% negative magnetoresistance under a negative 1.2 T magnetic field. In comparison to the above-mentioned Si-based magnetoresistance device with high resistivity, the magnetoresistance effect of this device is relatively small, but is very remarkable. This embodiment further indicates that even if there is no intrinsic silicon dioxide layer (i.e., thickness of the oxidation layer is 0), the magnetoresistance effect can still be exhibited.

The Si-based magnetoresistance devices according to the above-mentioned embodiments of the present invention can realize performances comparable to those of the magnetoresistor designed by Solin et al. in prior art, including a large magnetoresistance performance ($10^5$% of magnetoresistance under 7 T magnetic field without saturation) and an excellent low magnetic field sensitivity ($10^2$% magnetoresistance under 0.2 T magnetic field; and 30% magnetoresistance performance under 0.065 T magnetic field). In comparison to the magnetoresistance devices designed by Delmo and Schoonus et al. in prior art, the performances of the devices of the embodiments include a higher magnetoresistance value and a more sensitive low magnetic field magnetoresistance effect, the magnetoresistance devices of the embodiments can further operate in a lower voltage range (about 10V) and have a lower power consumption (1 mW or less). This kind of device of the present invention can further be utilized to sense a large magnetic field and the direction of the magnetic field. More importantly, in the process of manufacturing the magnetoresistance device according to the present invention, no other metallic elements are used except for electrode materials which commonly used Al, Ti and the like in a silicon process. Therefore, the magnetoresistance device can be produced with prior art silicon processes and manufacturing technology, and can be integrated into prior art Si-based microelectronic devices, so as to provide traditional microelectronic devices with versatile performances, such as magnetically controlled electronic functions, and facilitate upgrading of micro-electronics industry towards magnetic electronic industry.

Furthermore, the magnetoresistance device according to the present invention has a very simple structure, and a very high sensitivity of magnetoresistance for large magnetic field and very small magnetic field. From the viewpoint of fabrication process, the entire process of manufacturing the magnetoresistance device according to embodiments of the present invention is very simple, circumstance friendly and can use rich raw material sources. Therefore this kind of device has an excellent potential application prospect in fields of magnetic sensor, magnetic disc read head and the like.

Practical Application of Magnetoresistance Device According to the Present Invention (1) Si-Based Self-Energized Magnetic Sensor:

Since the presently main stream solar battery is a Si-based solar battery and has output power more than 10 mW/cm$^2$, and the Si-based magnetoresistance device according to the present invention has a power consumption of 1 mW/cm$^2$ and less, therefore a solar battery and a Si-based geometric giant magnetoresistance device can be manufactured in different areas on a small size, nail-like silicon substrate by non-uniform doping, and connected by leads. Positive and negative poles of a constant current source of the Si-based magnetoresistance device are connected with positive and negative poles of the solar battery, to form a Si-based self-energized magnetic sensor. This sensor needs no external power supply, and is portable and flexible for use.

(2) Si-Based Spintronics Device:

Input/output characteristics (I-V characteristics) of the magnetoresistance device itself according to the present invention exhibits non-linear behavior under zero magnetic field, that is, the subsection characteristic as shown in FIG. 6. When a current is smaller than a certain critical current, the apparent resistance is very small, on the order of Ohm. When a current reaches or exceeds this critical current, the apparent resistance suddenly increases to the order of kilo-ohm, while positive and negative magnetic field may shift the critical current upward or downward. Therefore, the Si-based magnetoresistance device according to the present invention has basic characteristics of a spintronics device, that is, modulation of device volt-ampere characteristic by a magnetic field. The magnetic controlling has an advantage over electrical controlling in the fact that magnetic controlling can be non-contact, so that the magnetoresistance device according to the present invention is suitable for locations where wire connecting is inconvenient.

(3) Non-Contact Magnetic Sensor:

The magnetoresistance device according to the present invention can be used for implementing non-contact magnetic sensors. This kind of sensors can be used as a speed measuring device, e.g. for measuring the speed of a bicycle or a gear. In the example of the speed measuring device of a bicycle, a Si-based magnetoresistance device according to the present invention is mounted on a front support frame of the bicycle; and a magnetic component such as a magnet is mounted on a spoke of the front wheel. The wheels rotate during the bicycle moves, every time the magnetoresistance device meets the magnet in a non-contact manner, the apparent resistance of the magnetoresistance device will increase. When the magnet moves away from the magnetoresistance device, the apparent resistance of the device decreases. By recording change time of the apparent resistance of the magnetoresistance device and using other parameters, the running speed of the bicycle can be measured. Of course, other than the bicycle speed, the magnetoresistance device can also be used for measuring a gear speed or a vehicle speed. The Si-based magnetoresistance device according to the present invention needs an operating magnetic field on the order of 100 mT or better. Since a common neodymium-iron-boron permanent magnet and a ferrite permanent magnet can easily generate a magnetic induction intensity up to the order of 100 mT on its surface, therefore the magnetoresistance device according to the present invention is feasible.

Only preferable specific implementations of the present invention are illustrated and described as above, and should be considered as illustrative and not restrictive to the protection scope of the present invention. Any variants or substitutions may be easily conceived by those skilled in the art within the scope of the present disclosure, and should be covered in the protection scope of the present invention. Therefore, the protection scope of the present invention should be interpreted by the claims.

The invention claimed is:

1. A magnetoresistance device comprising:
a semiconductor substrate;
an oxidation layer disposed on a surface of said semiconductor substrate;
electrodes disposed on said oxidation layer; and
at least one diode connected between at least two electrodes of said electrodes;
wherein a geometric shape formed by lines of connecting said electrodes comprises at least one long side having a long distance, and said diode is connected between electrodes on both ends of said at least one long side.

2. The magnetoresistance device according to claim 1, wherein said semiconductor substrate is a silicon substrate.

3. The magnetoresistance device according to claim 1, wherein said electrodes comprise at least four electrodes.

4. The magnetoresistance device according to claim 3, wherein said electrodes comprise four electrodes; and a geometric shape formed by lines of connecting said four electrodes is a rectangle.

5. The magnetoresistance device according to claim 1, wherein said oxidation layer has a thickness less than or equal to 5 nm.

6. The magnetoresistance device according to claim 1, wherein said oxidation layer is any one of $SiO_2$, $Al_2O_3$ and MgO.

7. The magnetoresistance device according to claim 1, wherein said electrodes contain a metal material.

8. The magnetoresistance device according to claim 7, wherein the metal material in said electrodes forms Ohmic contact with said semiconductor substrate, and comprises any one of indium (In), aluminum (Al), titanium (Ti) and Aurum (Au).

9. The magnetoresistance device according to claim 1, wherein said semiconductor substrate has a resistivity greater than 0.1 Ω·cm.

10. The magnetoresistance device according to claim 1, wherein a minority carrier of said semiconductor substrate has a life greater than 10 μs.

11. The magnetoresistance device according to claim 2, wherein said silicon substrate is a monocrystalline silicon substrate; and a mobility of said monocrystalline silicon substrate is at least 0.1 $m^2$/Vs for n type silicon, and at least 0.04 $m^2$/Vs for p type silicon.

12. The magnetoresistance device according to claim 1, wherein a forward breakover voltage of said diode is between 0.01 V and 1V; and a reverse breakdown voltage of said diode is between 0.6 V and 20 V.

13. The magnetoresistance device according to claim 4, wherein said rectangle satisfies: $L_C/W_C \geq 5$; wherein $L_C$ represents an interval between two electrodes on a long side of said rectangle; and $W_C$ represents an interval between two electrodes on a short side having short connecting line of said rectangle.

14. The magnetoresistance device according to claim 1, wherein electrodes on both ends of at least one short side having a short distance in said geometric shape are output terminals of said magnetoresistance device.

15. A Si-based self-energized magnetic sensor, comprising:
a silicon substrate;
an oxidation layer disposed on a surface of a first region of said silicon substrate;
electrodes disposed on said oxidation layer;
at least one diode connected between at least two electrodes of said electrodes; and
a Si-based solar battery disposed on a second area of said silicon substrate which acts as a substrate;
wherein power output terminals of said Si-based solar battery are connected with at least two of said electrodes to output electrical energy.

* * * * *